(12) United States Patent
Sato et al.

(10) Patent No.: US 7,495,309 B2
(45) Date of Patent: Feb. 24, 2009

(54) SEMICONDUCTOR DEVICE AND MANUFACTURING METHOD THEREOF

(75) Inventors: Motonobu Sato, Kasugai (JP); Hiroshi Nakadai, Kawasaki (JP); Toyoji Sawada, Kawasaki (JP); Satoshi Otsuka, Kawasaki (JP); Masayuki Nakada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/224,434

(22) Filed: Aug. 21, 2002

(65) Prior Publication Data

US 2003/0141568 A1     Jul. 31, 2003

(30) Foreign Application Priority Data

Jan. 31, 2002   (JP)   ............... 2002-023995

(51) Int. Cl.
   *H01L 29/93*   (2006.01)
(52) U.S. Cl. .............. 257/529; 257/209; 438/132; 438/215; 438/281; 438/333; 438/467
(58) Field of Classification Search ........... 257/209, 257/529; 337/297, 159, 168, 176, 171; 438/132, 438/215, 281, 333, 467, 601, 33
See application file for complete search history.

(56) References Cited

U.S. PATENT DOCUMENTS

| | | | | |
|---|---|---|---|---|
| 5,543,774 A | * | 8/1996 | Lof | ............. 337/297 |
| 6,259,146 B1 | * | 7/2001 | Giust et al. | ............ 257/529 |
| 6,335,229 B1 | * | 1/2002 | Pricer et al. | ............ 438/132 |
| 6,638,795 B2 | * | 10/2003 | Ikeda et al. | ............ 438/132 |
| 2002/0037606 A1 | * | 3/2002 | Pricer et al. | ............ 438/132 |

FOREIGN PATENT DOCUMENTS

| | | |
|---|---|---|
| JP | 04-014246 | 1/1992 |
| JP | 7-78872 | 3/1995 |
| JP | 11-154706 | 6/1999 |
| JP | 11-224900 | 8/1999 |
| JP | 11-284074 | 10/1999 |
| JP | 2000-049234 | 2/2000 |
| JP | 2000-057933 | 2/2000 |
| JP | 2001-298093 | 10/2001 |

OTHER PUBLICATIONS

Office Action from Japanese Patent Office dated Apr. 26, 2005, in the corresponding Japanese Patent Application No. 2002-023995.

* cited by examiner

*Primary Examiner*—Evan Pert
*Assistant Examiner*—Tan N Tran
(74) *Attorney, Agent, or Firm*—Westerman, Hattori, Daniels & Adrian, LLP.

(57) ABSTRACT

A redundant fuse is provided with a redundant length, here a winding structure, at one end thereof, here at a vicinity of a second wire side to which a high voltage (Vcc) is impressed. A disconnected portion is provided between the other end side of the redundant fuse, here a second wire side which is on the ground potential (GND) and the winding structure.

8 Claims, 16 Drawing Sheets

FORMING OF A MOS TRANSISTOR

AFTER FORMING OF A BULK CONTACT

DEPOSITING OF AN INSULATION FILM OF A FIRST WIRE

PATTERNING OF THE FIRST WIRE

PLATING OF THE FIRST WIRE

POLISHING OF THE FIRST WIRE

FORMING OF FIRST AND SECOND INTERLAYER INSULATION FILM

PATTERNING OF THE VIA HOLE

ETCHING THE VIA HOLE

PROTECTING OF THE VIA

PATTERNING OF A SECOND WIRE AND FIRST ETCHING

SECONDARY ETCHING OF THE SECOND WIRE

PLATING OF THE SECOND WIRE

POLISHING OF THE SECOND WIRE

FORMING OF THE INTERLAYER

SEMICONDUCTOR DEVICE AND MANUFACTURING METHOD THEREOF

CROSS-REFERENCE TO RELATED APPLICATIONS

This application is based upon and claims priority of Japanese Patent Application No. 2002-023995, filed on Jan. 31, 2002, the contents being incorporated herein by reference.

BACKGROUND OF THE INVENTION

1. Field of the Invention

This invention relates to a semiconductor device which is provided with a wire structure having a wire and a redundant fuse, a manufacturing method thereof and a method of disconnecting the fuse. Particularly, the present invention is best suited when applied to a semiconductor device provided with a wire structure in which a wire is formed of a material containing at least copper (Cu).

2. Description of the Related Art

Miniaturization and multilevel interconnection of a wire have been recently progressed with increasing speed along with high-density design of a semiconductor element and downsizing of a chip. In a logic device having the multilevel interconnection, a wire delay is becoming one of the dominant factors of a signal delay of the device. The signal delay of the device is in proportion to a product of a wire resistance value and a wire capacity. Therefore, it is important to reduce the wire resistance value and the wire capacity in order to improve the wire delay.

To decrease the wire resistance, a formation of a Cu wire has been investigated. Particularly, a combination of a low permittivity film and the Cu wire at a global wire portion, which largely influences the wire delay, contributes an improvement of performance of the device greatly.

By the way, a usual semiconductor device is provided with a redundant fuse in order to give a redundancy to a wire and so on. It is convenient to form the fuse with metal which is also served for the wire. However, when forming the wire with Cu as a material, it is difficult to use Cu also for a material of the fuse considering moisture resistance. Therefore, for the material of the fuse, metal with a superior moisture resistance, for example tungsten (W), is used in this case.

However, when W is used for the material of the redundant fuse considering moisture resistance, corrosion is likely to proceed from a disconnected portion of the fuse by a bias voltage impressed thereto to recognize whether the fuse is disconnected or not, and then there rises a problem that a short cut finally occurs in the disconnected fuse.

This problem is conspicuous in a configuration of a bias circuit to which a bias voltage is always impressed particularly after the power turned on as compared with a configuration of a so-called non-bias circuit to which a bias voltage is not impressed except when the power turned on. There are naturally many extra components in the non-bias circuit owning to its properties, thereby there being a drawback to increase a chip area. Accordingly, the configuration of the bias circuit is preferable, and therefore, the problem of the occurrence of corrosion by disconnecting the redundant fuse cannot be ignored.

SUMMARY OF THE INVENTION

The present invention is made in view of the aforementioned problem, and it is an object of the present invention to provide a semiconductor device, a manufacturing method thereof and a method of disconnecting a fuse, in which a corrosion resistance of the fuse can be enhanced and occurrence of corrosion caused by disconnection can be restrained on the fuse which composes a wire structure along with a wire (particularly, a wire containing Cu), whereby it is possible to sufficiently correspond to further improvement of integration degree in a large scale in the semiconductor device in future.

The inventors of the present invention have reached to various aspects of the invention described below after a deep investigation.

The present invention is best suited when applied to a wire, particularly a wire formed of a material containing copper. This invention concerns a semiconductor device which is provided with a wire structure including the wire and a fuse in which the fuse has a redundant length (a form of a structure for delaying corrosion), and a manufacturing method thereof.

A winding structure, a branch structure, a wide structure and/or a thick film structure etc. are/is best suited for the redundant length.

Another aspect of the present invention is that the fuse is formed of a corrosion resistant material.

In this case, metal containing aluminum or polycrystalline silicon are best suited for the corrosion resistant material.

DETAILED DESCRIPTION OF THE PREFERRED EMBODIMENTS

Explanation of Operational Principle of Invention

First of all, an operational principle of the present invention is described.

Figure 1A:
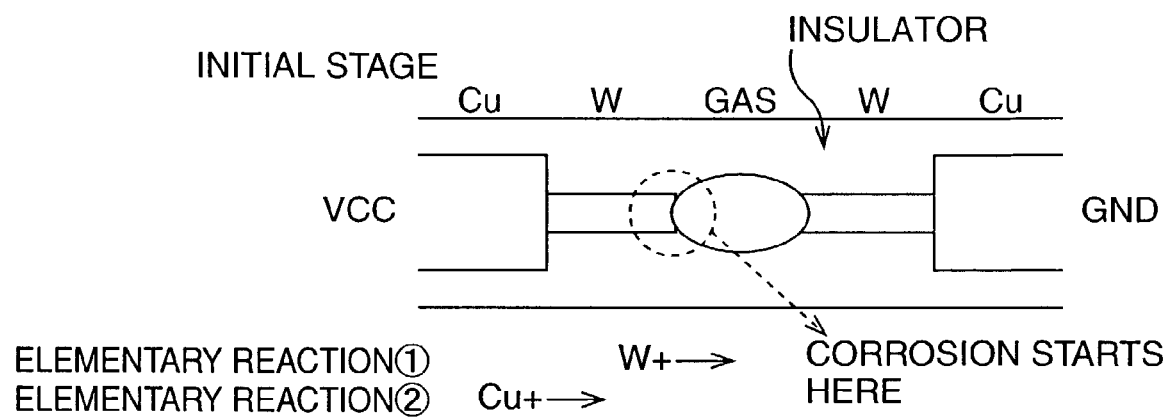
FIGS. 1A and 1B are pattern diagrams for illustrating a mechanism in which corrosion is caused by disconnecting a redundant fuse (initial stage)
Figure 1B:
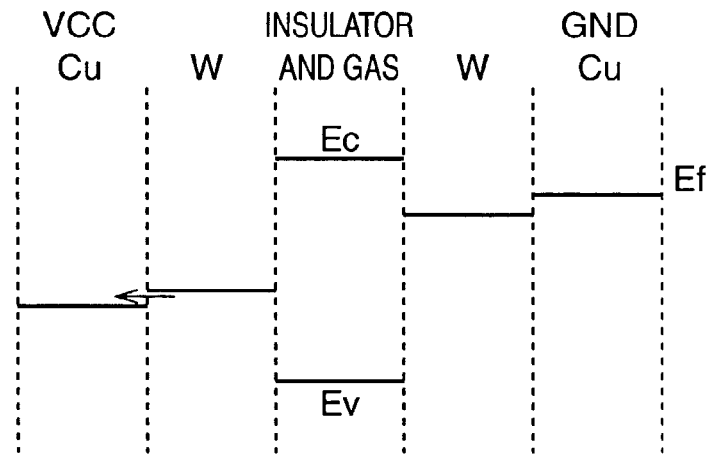
Figure 2A:
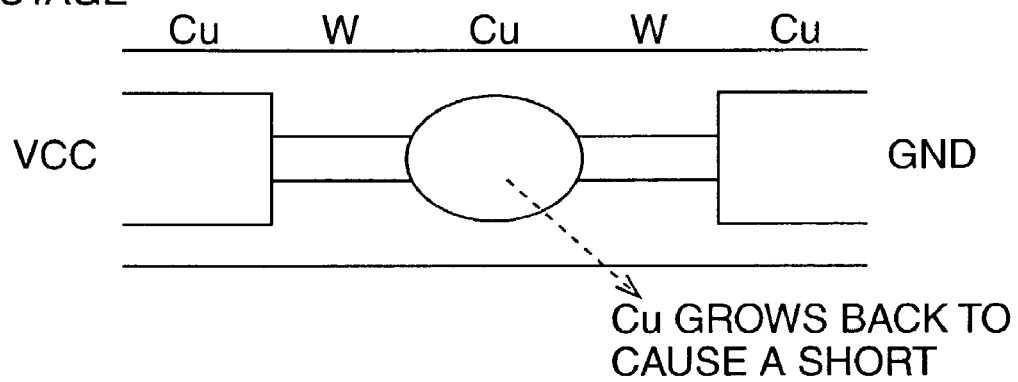
FIGS. 2A and 2B are pattern diagrams for illustrating a mechanism in which corrosion is caused by disconnecting the redundant fuse (last stage)
Figure 2B:
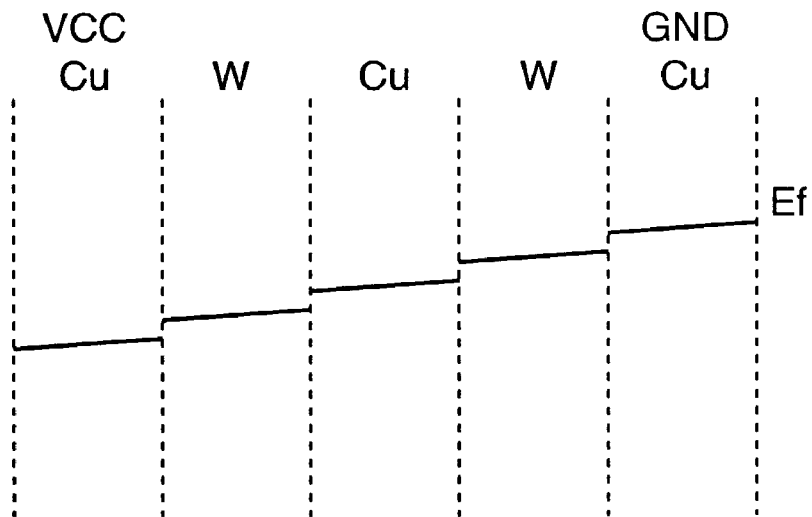

FIGS. 1A and 1B, and FIGS. 2A and 2B are pattern diagrams for illustrating a mechanism in which corrosion is caused by disconnecting a redundant fuse. FIGS. 1A and 1B show an initial stage thereof and FIGS. 2A and 2B show a last stage thereof. In addition, FIGS. 1A and 2A are plane views showing conditions at a vicinity of redundant fuses and FIGS. 1B and 2B are energy band diagrams corresponding to FIGS. 1A and 2A respectively.

When a bias voltage is impressed to the redundant fuse in the initial stage as shown in FIG. 1A, an energy band as shown in FIG. 1B is formed. Fermi levels of Cu and W become stepwise as shown. Incidentally, since it can be considered that a disconnected portion is connected through an atmospheric gas and a surrounding interlayer insulation film, this disconnected portion is represented as an insulator in FIG. 1B.

Cu and W on the ground (GND) side do not oxidize because of a constant electron supply. On the other hand, Cu and W on a high voltage impressed (Vcc) side are in a condition that an oxidization reaction easily takes place because there is no electron supply from the GND side. Here, "the high voltage impressed side" indicates a higher voltage side of both ends of the redundant fuse. Particularly, since W on the Vcc side has its electron taken by Cu, the oxidization reaction first starts from the disconnected end of W to which an electron is not supplied ($W \rightarrow W^{n+}+ne^-$).

When the oxidization of W proceeds to reach Cu, the electron supply from W to Cu stops and the oxidization reaction of Cu starts ($Cu \rightarrow Cu^{n+}+ne^-$). $Cu^{n+}$ generated here grows back by a force in a GND direction caused by an electric field. $Cu^{n+}$ that grows back is reduced by the electron supply from W on the GND side or an atmospheric gas so as to be deposited at the disconnected portion of the fuse. A large quantity of the deposited Cu at last causes a short cut in the fuse as shown in FIG. 2A. At this time, a barrier which corresponds to the insulator in the energy band disappears as shown in FIG. 2B.

In this invention, from the point of view to defer the occurrence of a short circuit which is caused in accordance with the aforementioned mechanism and to secure a guaranteed life of the device, a redundant length is provided at a predetermined portion of the fuse, specifically between the disconnected portion of the fuse and the high voltage impressed side, or the fuse is formed of a corrosion resistant material. A winding structure, a wide/thick film structure, a branch structure, and the like are suitable for the former redundant length as described below. Metal containing Al, polycrystalline silicon to which an impurity is added, and the like are suitable for the latter corrosion resistant material. The fuse structured like this allows a fuse length between the disconnected portion and an end of the high voltage impressed side to be extended and a fuse volume therebetween to be increased. Therefore, when using a wire material containing Cu, it is possible to defer largely a starting point for $Cu^{n+}$ to grow back so as to realize a secured guaranteed life.

SPECIFIC EMBODIMENTS

According to the above-described operational principle of this invention, various preferred embodiments to which the present invention is applied will be explained by reference of the drawings hereinafter.

(Forming of MOS Transistor Structure)

First of all, a MOS transistor structure is formed on a semiconductor substrate.

Figure 3A:
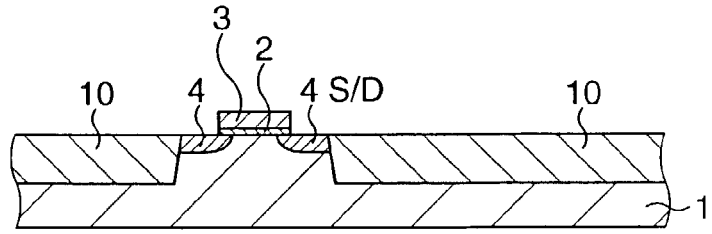
FIGS. 3A to 3D are schematic cross-sectional views showing a manufacturing method of a semiconductor device related to a first embodiment in the processing order.

Specifically, element isolation is performed on a silicon semiconductor substrate 1 by a LOCOS method, a STI method, or the like as shown in FIG. 3A. Here, an isolation structure 10 formed on the semiconductor substrate 1 and provided with a trench which is filled with an insulator is formed by the STI method or the like so as to define an element active region.

Next, a thin gate insulation film 2 made of $SiO_2$ or SiON is formed on the semiconductor substrate 1. Thereafter, a polycrystalline silicon film is formed thereon, and the polycrystalline silicon film and the gate insulation film 2 are patterned to form a gate electrode 3 above the semiconductor substrate 1 via the gate insulation film 2. Ion implantation with an impurity is performed on a front surface layer of the semiconductor substrate 1 at both sides of the gate electrode 3 by using the gate electrode 3 as a mask so as to form a source/drain 4, constructing the MOS transistor structure.

(Forming Wire Structure)

Subsequently, a wire structure is formed.

Note that the semiconductor substrate 1 and the MOS transistor which are described above are omitted to draw in FIGS. 3A to 10B below.

Figure 3B:
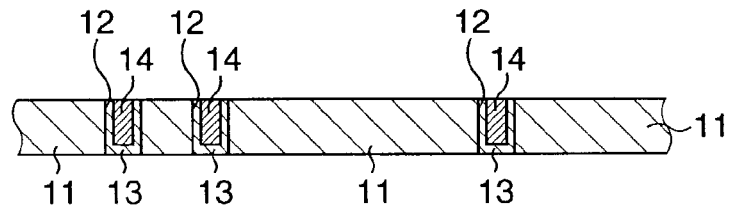

First, as shown in FIG. 3B, an interlayer insulation film 11 is formed by deposition in a manner to cover the semiconductor substrate 1. Thereafter, a via hole 12 running to a lower wire is formed open at the interlayer insulation film 11. Next, a foundation layer 13 made of TiN or the like is formed in a manner to cover an inside wall of the via hole 12, and a W film is formed by deposition to have a film thickness with which the via hole 12 is filled. Thereafter, the W film is polished by chemical mechanical polishing (CMP) so as to form a W plug 14 in which only the via hole 12 is filled with W.

Figure 3C:
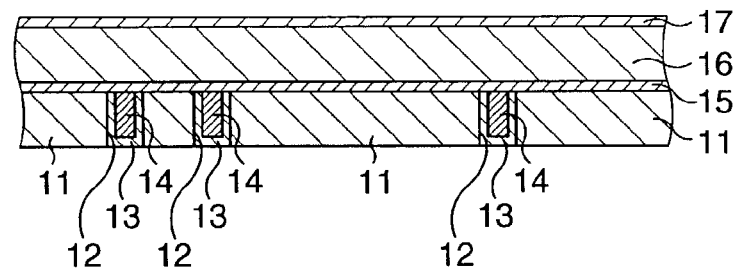

Subsequently, as shown in FIG. 3C, a SiN film 15 is formed to have a film thickness of approximately 30 nm on the interlayer insulation film 11 and the W plug 14. Next, an interlayer insulation film 16 made of FSG (fluoro-silicate glass) is formed by deposition on the SiN film 15 to have a film thickness of approximately 500 nm. Thereafter, an antireflection film 17 for exposure of photolithography is formed.

Figure 3D:
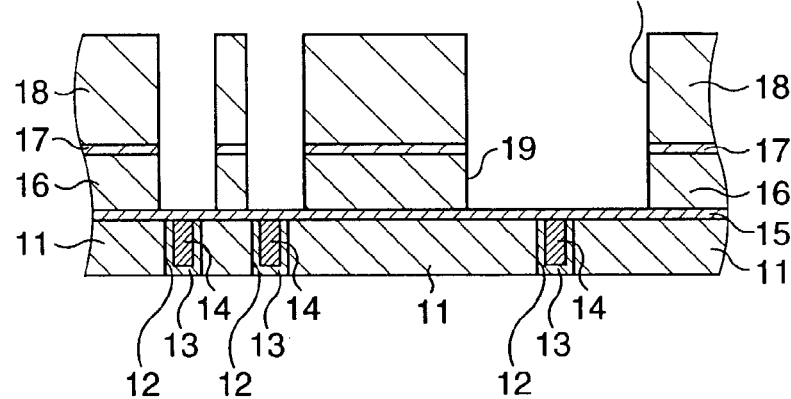

Subsequently, as shown in FIG. 3D, a photoresist 18 is applied and processed by photolithography, and a wire trench pattern 18a being open on each W plug 14 is formed. Next, the antireflection film 17 and the interlayer insulation film 16 are dry-etched by using the photoresist 18 as a mask and the SiN film 15 as an etching stopper.

Figure 4A:
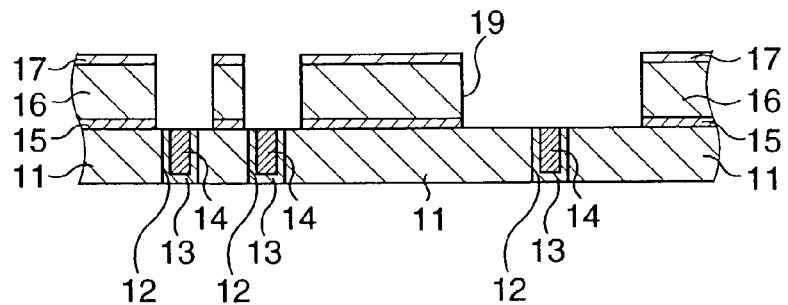
FIGS. 4A to 4C are schematic cross-sectional views showing the manufacturing method of the semiconductor device related to the first embodiment following to the processes in FIGS. 3A to 3D in the processing order.

Subsequently, as shown in FIG. 4A, the photoresist 18 is removed by an ashing treatment or the like. Thereafter, the SiN film 15 is further dry-etched to expose surfaces of the interlayer insulation film 11 and each W plug 14, so that a first wire trench 19 following the shape of the wire trench pattern is formed.

Figure 4B:
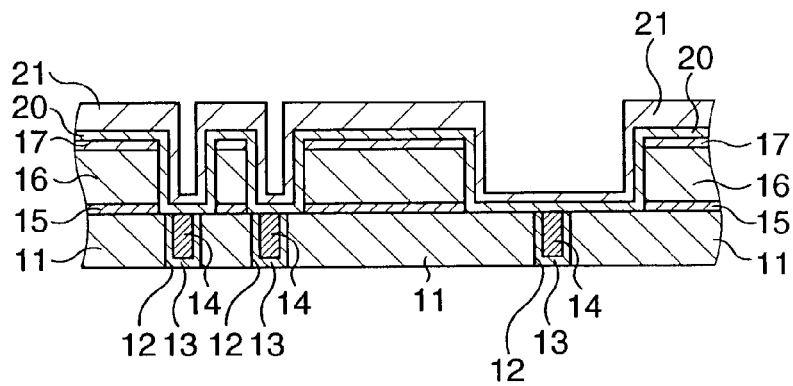

Subsequently, as shown in FIG. 4B, a barrier metal film 20 made of TaN with a film thickness of approximately 25 nm and further a Cu film 21 as a seed metal film with a film thickness of approximately 200 nm are formed by deposition successively in a vacuum in a clustered sputtering apparatus. Here, it is preferable to perform RF treatment and a formation of the barrier metal film 20 and the Cu film 21 successively in a vacuum.

Figure 4C:
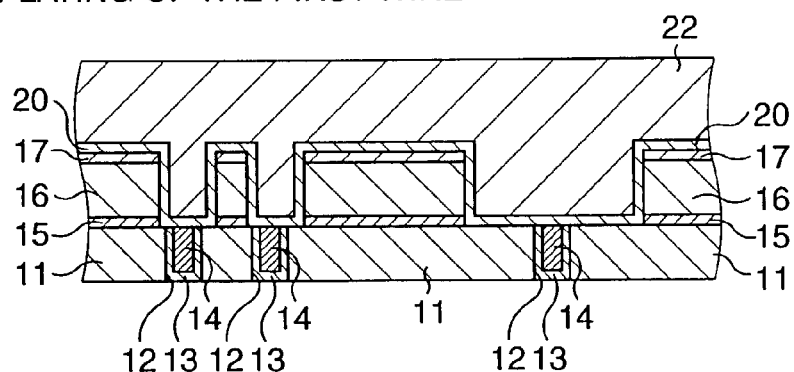

Subsequently, as shown in FIG. 4C, a Cu film 22 is formed to have a film thickness with which the first wire trench 19 is filled, here approximately 1 μm, by a plating method using the barrier metal 20 as an electrode.

Figure 5A:
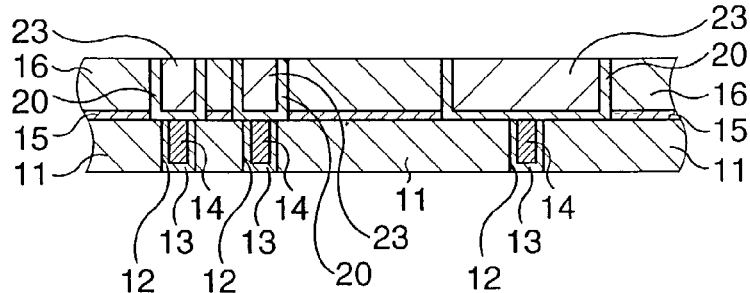
FIGS. 5A to 5C are schematic cross-sectional views showing the manufacturing method of the semiconductor device related to the first embodiment following to the processes in FIGS. 4A to 4C in the processing order.

Subsequently, as shown in FIG. 5A, the Cu film 22 is remained only in the first wire trench 19 by polishing the Cu film 22 (21) and the barrier metal film 20 by the CMP method in order to isolate the Cu film 22 by a damascene method, so that a first wire 23 is formed.

Figure 5B:
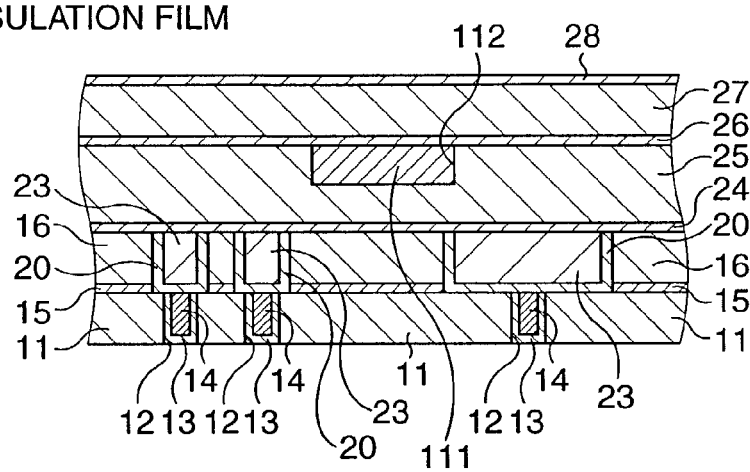

Subsequently, as shown in FIG. 5B, a SiN film 24 as a diffusion barrier (passivation) on a surface of the first wire 23 is formed by deposition to have a film thickness of approximately 70 nm. Thereafter, an interlayer insulation film 25 made of FSG is formed on the SiN film 24 to have a film thickness of approximately 700 nm.

A redundant fuse 111 made of tungsten (W) is then formed in the interlayer insulation film 25.

Specifically, a fuse trench 112 is patterned and formed in the interlayer insulation film 25 to have a depth of approximately 700 nm and a width of approximately 0.50 μm. Here, the fuse trench 112 is formed in such a manner that a predetermined portion is to be a winding shape as an upper surface shape thereof.

Subsequently, a W film is deposited on the interlayer insulation film 25 in a manner to fill the fuse trench 112. Thereafter, the W film is polished to be flat by the CMP method. Accordingly, the redundant fuse 111 where only the fuse trench 112 is filled with the W film and the predetermined portion at the upper surface shape is formed to be the winding shape is formed. Note that a material for this redundant fuse is not limited to W and any metal (conductive material) having a superior moisture resistance other than Cu can be used for the material.

Subsequently, a SiN film 26 is formed on the interlayer insulation film 25, in which the redundant fuse 111 is formed, and an interlayer insulation film 27 made of FSG is formed on the SiN film 26 to have a film thickness of approximately 700 nm, and an antireflection film 28 is further formed.

Figure 5C:
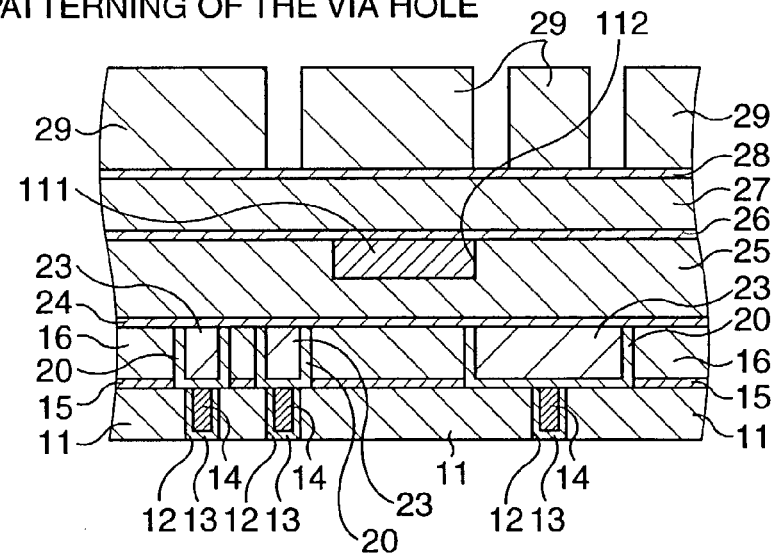

Subsequently, as shown in FIG. 5C, a photoresist 29 is applied and processed by photolithography, and an open-hole pattern 29a being open above each first wire 23 is formed.

Figure 6A:
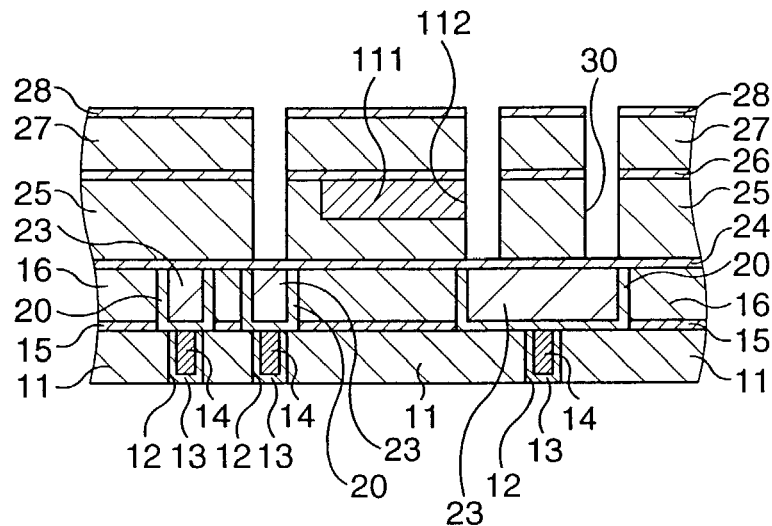
FIGS. 6A and 6B are schematic cross-sectional views showing the manufacturing method of the semiconductor device related to the first embodiment following to the processes in FIGS. 5A to 5C in the processing order.

Subsequently, as shown in FIG. 6A, the antireflection film 28, the interlayer insulation film 27 and the interlayer insulation film 25 are dry-etched by using the photoresist 29 as a mask and the SiN film 24 as an etching stopper, thereby forming a via hole 30 following the shape of the open-hole pattern 29a. Next, the photoresist 29 is removed by the ashing treatment or the like.

Figure 6B:
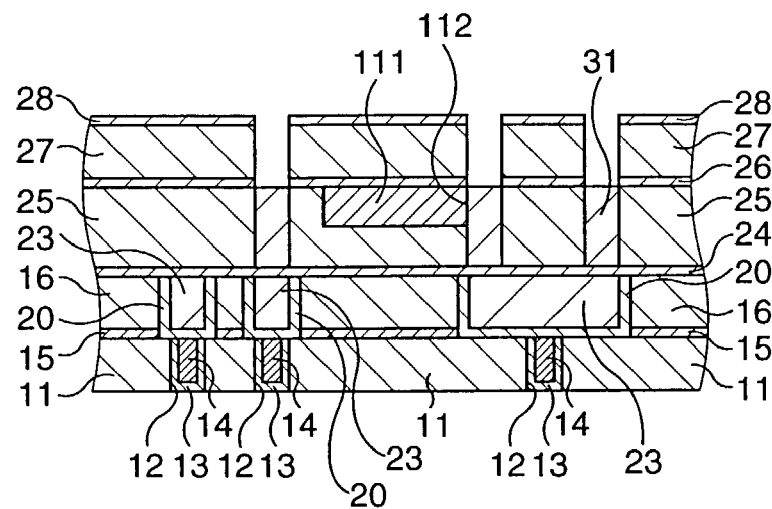

Subsequently, as shown in FIG. 6B, a protective material 31 made of a resist or the like for preventing the first wire 23 from surface oxidation is filled on a lower portion of the formed via hole 30.

Figure 7A:
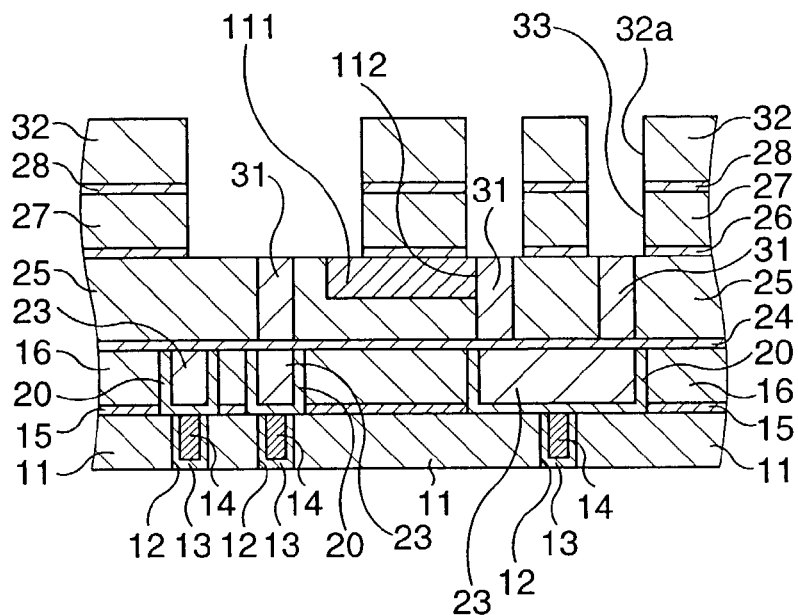
FIGS. 7A and 7B are schematic cross-sectional views showing the manufacturing method of the semiconductor device related to the first embodiment following to the processes in FIGS. 6A and 6B in the processing order.

Subsequently, as shown in FIG. 7A, a photoresist 32 is applied and processed by photolithography, and a wire layer pattern 32a being open above each via hole 30 is formed. Next, the antireflection film 28 and the interlayer insulation film 27 are dry-etched by using the photoresist 32 as a mask, thereby forming a second wire trench 33 following the shape of the wire layer pattern 32a. At this time, the second wire trench 33 is formed in a manner to expose parts of a surface of the redundant fuse 111 from end portions of the adjacent second wire trenches 33.

Figure 7B:
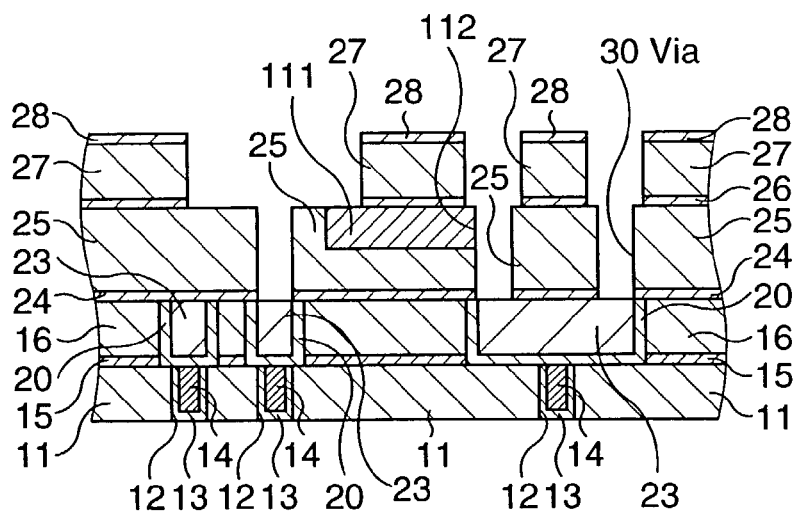

Subsequently, as shown in FIG. 7B, the photoresist 32 and the protective material 31 are removed by the ashing treatment or the like. Thereafter, the SiN film 24 which is remained at the bottom of the via hole 30 and the SiN film 26 which is remained at the bottom of the second wire trench 33 are removed by an overall dry etching. At this time, the second wire trench 33 and the via hole 30 are united.

Figure 8A:
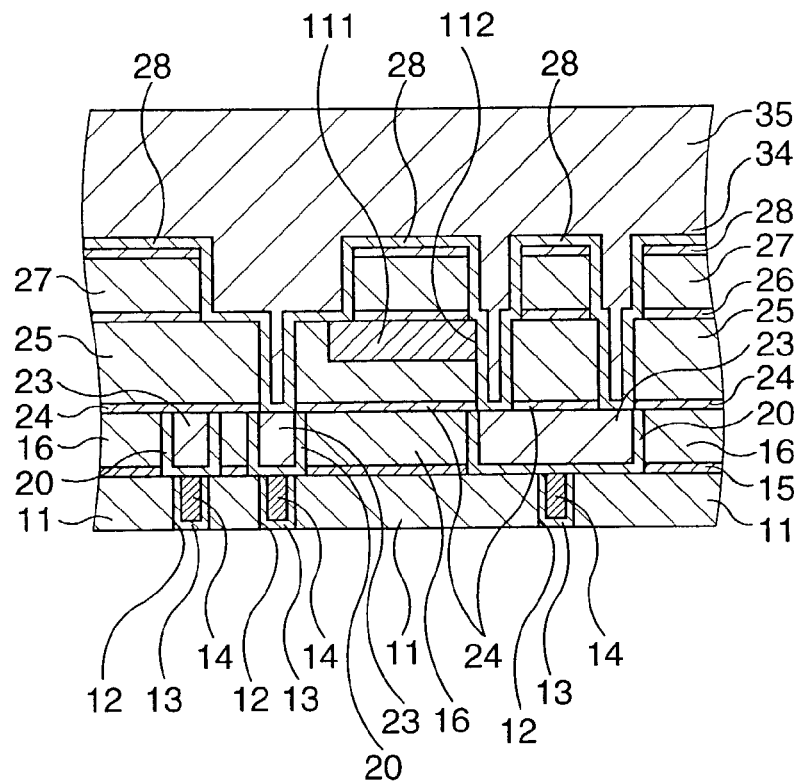
FIGS. 8A and 8B are schematic cross-sectional views showing the manufacturing method of the semiconductor device related to the first embodiment following to the processes in FIGS. 7A and 7B in the processing order.

Subsequently, as shown in FIG. 8A, a barrier metal film 34 made of TaN with a film thickness of approximately 25 nm and a further Cu film (not shown) as a seed metal film with a film thickness of approximately 200 nm are formed by deposition successively in a vacuum in a sputtering apparatus. Next, a Cu film 35 is formed to have a film thickness with which the second wire trench 33 and the via hole 30 are filled, here approximately 1 μm, by the plating method using the barrier metal 34 as an electrode.

Figure 8B:
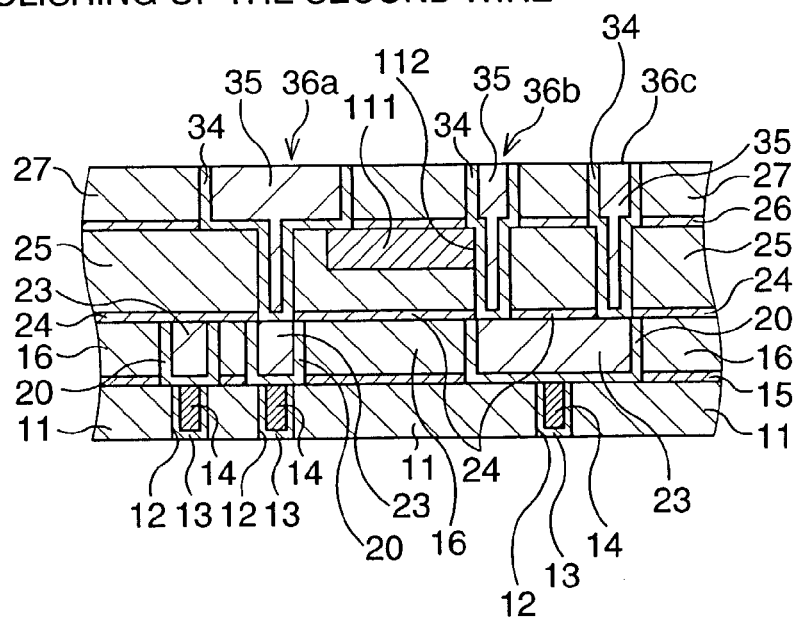

Subsequently, as shown in FIG. 8B, the Cu film 35 is remained only in the second wire trench 33 and the via hole 30 by polishing the Cu film 35 and the barrier metal film 34 by the CMP method in order to isolate the Cu film 35 by a damascene method. Thereafter second wires 36a, 36b and 36c are formed by cleaning with a wet treatment so as to complete a wire composed of the first wire 23 and the second wires 36a, 36b and 36c. At this time, adjacent lower wires, the second wires 36a and 36b in the shown example, are connected to the redundant fuse 111 via the barrier metal film 34 so as to complete a wire structure including the aforementioned wire and the redundant fuse 111.

Figure 9:
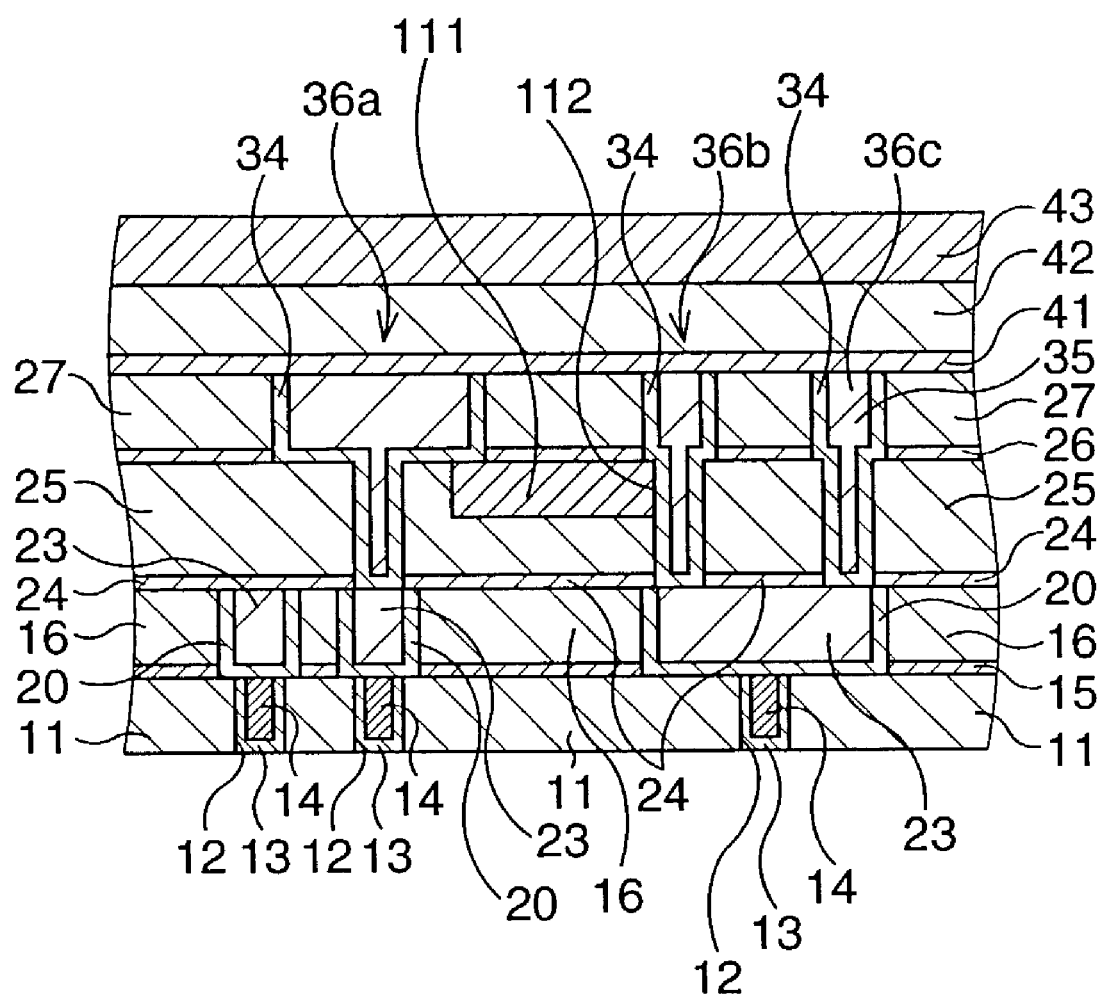
FIG. 9 is a schematic cross-sectional view showing the manufacturing method of the semiconductor device related to the first embodiment following to the processes in FIGS. 8A and 8B in the processing order.

Thereafter, as shown in FIG. 9, a SiN film 41, a SiO$_2$ film 42 and a SiN film 43 are formed to have film thickness of approximately 100 nm, 400 nm and 300 nm respectively as cover films so as to complete a semiconductor device having the aforementioned wire structure.

(Specific Structure of Redundant Fuse)

Figure 10A:
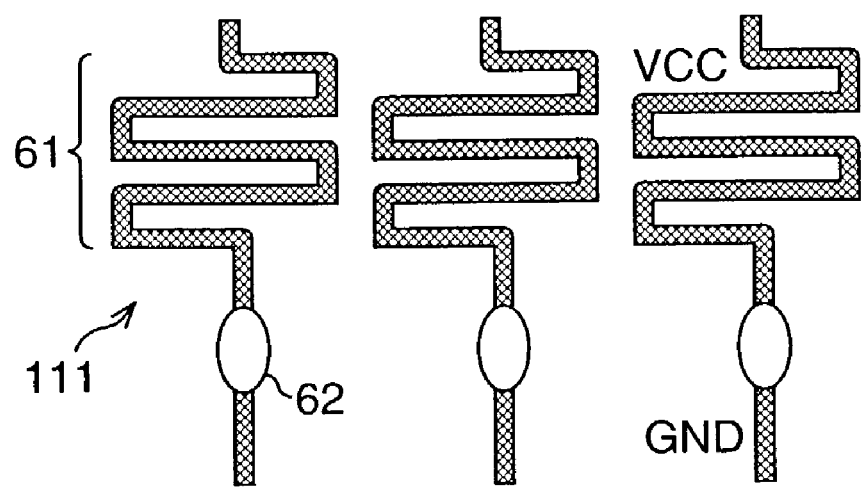
FIGS. 10A and 10B are pattern diagrams for illustrating a structure of a redundant fuse of the semiconductor device related to the first embodiment.

In this embodiment, as shown in FIG. 10A, the redundant fuse 111 made of W is provided with a form of a redundant length, here a winding structure 61, at one end side thereof, here at a vicinity of the second wire 36a side to which a high voltage (Vcc) is impressed. In this case, a disconnected portion 62 is provided between the other end side of the redundant fuse 111, here between the second wire 36b side which is on the ground potential (GND) and the winding structure 61.

In this way the redundant fuse 111 provided with the winding structure 61 allows a fuse length between the disconnected portion 62 and the end of the high voltage impressed side to be extended substantially and a fuse volume therebetween to be increased. Therefore, it is possible to defer a starting point for $Cu^{n+}$ to grow back significantly so as to realize a secured guaranteed life.

Figure 10B:
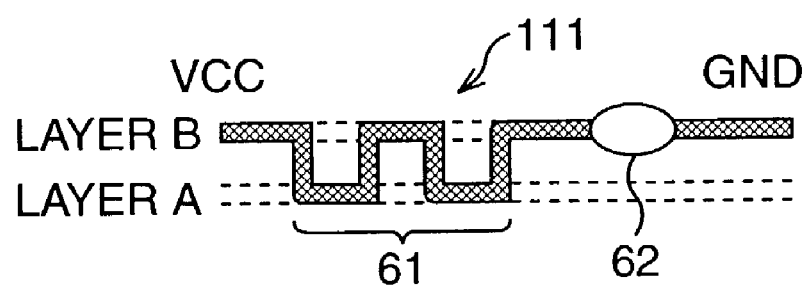

Moreover, as shown in FIG. 10B, the redundant fuse 111 may be formed to be multilevel, in the shown example the fuse layer being formed to be bi-level, at a portion of the winding structure 61, and the redundant fuse 111 may be structured to further wind up and down between the two layers. This multilevel redundant fuse 111 allows upper and lower fuse layers to be connected one another by making use of the multilevel interconnection structure, so that a fuse material can be curved up and down (in a vertical direction). This multileveled structure enables a fuse length and a fuse volume between the disconnected portion 62 and an end of the high voltage impressed side (the second wire 36a) to be further increased. Therefore, it is possible to secure a guaranteed life of the device by obtaining a desired fuse length even with a small area.

(Experiment of Incidence of Defects by Disconnecting Redundant Fuse)

A result of an experiment of increasing moisture resistance on redundant fuses 111 in both of a non-bias circuit configuration and a bias circuit configuration shown in FIG. 10A is explained based on the comparison with comparative examples 1 to 3.

Figure 11A:
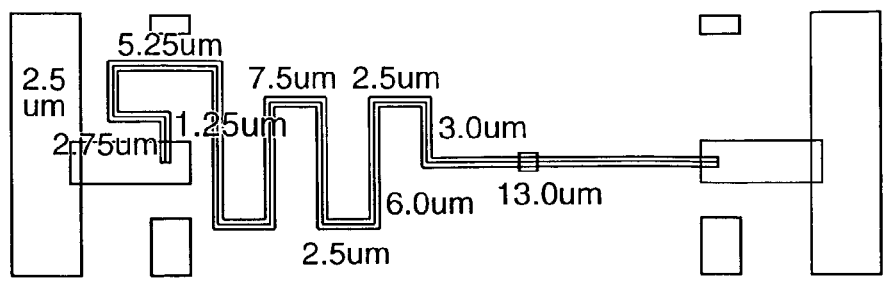
FIGS. 11A to 11D are schematic plane views showing each sample in an experiment of increasing moisture resistance.
Figure 11B:
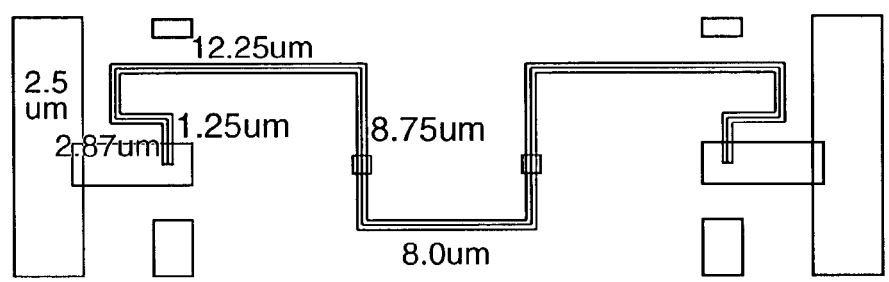
Figure 11C:
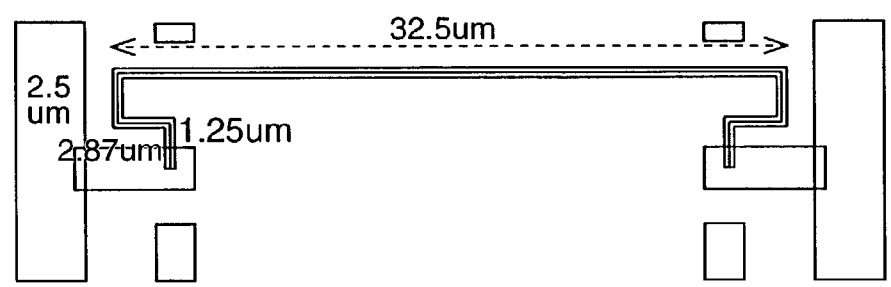
Figure 11D:
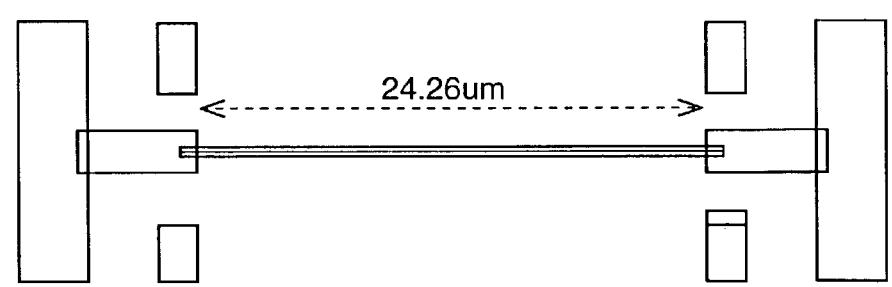

In this experiment, a redundant fuse of this embodiment is assigned to a sample 1 (FIG. 11A) and redundant fuses of the comparative examples 1 to 3 are assigned to samples 2 to 4 (FIG. 11B to 11D). An incidence of defects in each sample is calculated respectively when each storage time from a disconnected point by a laser radiation is approximately 2000 hours under the condition that temperature is 85° C., humidity is 85% and impressed voltage is 2 V.

As for the comparative examples, the sample 4 (FIG. 11D) uses a redundant fuse in a straight shape which is conventionally used, the sample 3 (FIG. 11C) uses one provided with a small winding structure of one turn at both end portions thereof respectively, and the sample 2 (FIG. 11B) uses one provided with a small winding structure of one turn at both end portions thereof respectively and further with a winding structure of one turn at a center portion thereof.

As for disconnected portions of each redundant fuse, the sample 1 of the redundant fuse of this embodiment has one portion between the winding structure 61 and an end of a low voltage impressed side similar to the disconnected portion 62, and the samples 2 to 4 have two portions at a vicinity of a center portion. Incidentally, a conventional redundant fuse generally has two disconnected portions, thereby ensuring a certainty of disconnection to elongate a life of the device.

A result of the experiment in the bias circuit configuration is shown in table 1.

TABLE 1

| length (μm) width (μm) thickness (μm) volume (μm³) between the disconnected portion and the high voltage impressed side | | | | incidence of defects |
|---|---|---|---|---|
| sample 1 | 54.7 | 0.5 | 0.7 | 19.15 | 0.19 |
| sample 2 | 23.6 | 0.5 | 0.7 | 8.26 | 0.79 |
| sample 3 | 15.3 | 0.5 | 0.7 | 5.36 | 0.97 |
| sample 4 | 7.4 | 0.5 | 0.7 | 2.59 | 1 |

Figure 12A:
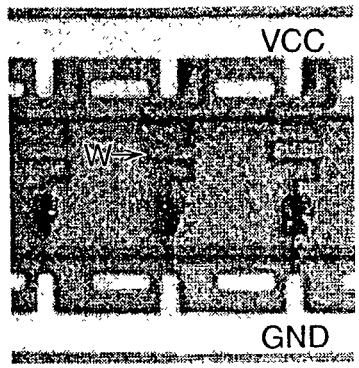
FIGS. 12A to 12C are photomicrographs showing conditions of samples when performing the experiment of increasing moisture resistance practically to a sample 1 and a sample 4.
Figure 12B:
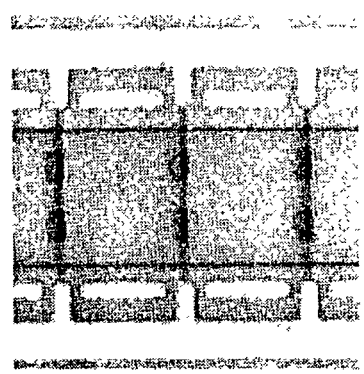
Figure 12C:
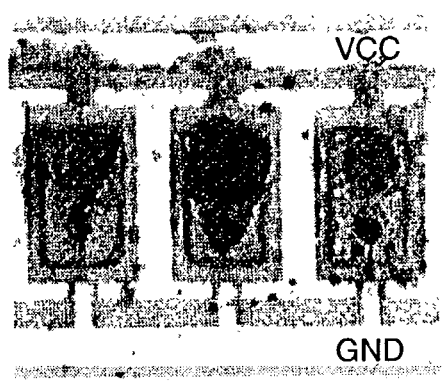

FIGS. 12A to 12C are photomicrographs showing conditions when performing the experiment of increasing moisture resistance practically in the sample 1 and the sample 4. FIG. 12A shows a condition of the sample 1 after passing the storage time, FIG. 12B shows a condition of the sample 4 immediately after the disconnection, and FIG. 12C shows a condition of the sample 4 after passing the storage time, respectively.

Incidentally, in the case of the non-bias circuit configuration, any occurrence of defects is not seen in all the samples 1 to 4.

On the other hand, in the case of the bias circuit configuration, incidence of defects in the sample 3 is 0.97, one in the sample 2 is 0.79, and one in the sample 1 is 0.19 when each incidence of defects is estimated relatively by regarding an incidence of defects in the sample 4 to be 1, showing a result that the sample 1 is outstandingly superior as shown in Table 1. In this way, it is recognized that the use of the redundant fuse in the sample 1 of this embodiment, particularly when adopting the bias circuit configuration, has a significantly large effect of restraining the incidence of defects in the redundant fuse.

As described above, according to the semiconductor device, particularly the redundant fuse 111 which is a component thereof, of this embodiment, a corrosion resistance of the fuse 111 can be enhanced and the occurrence of corrosion caused by disconnection can be restrained, so that it is possible to sufficiently correspond to further improvement of integration degree in a large scale in the semiconductor device in future.

Modifications of First Embodiment

Various modifications of the first embodiment are described next. In these modifications, a semiconductor device provided with a wire structure having a Cu multilevel wire and a redundant fuse is illustrated similar to the first embodiment. However they are different in that shapes of redundant fuses are different one another. Note that tungsten (W) is used for a material of the redundant fuse similarly to the first embodiment in each modification. The same components and the like as those described in the first embodiment are given the same numerals and explanations thereof are omitted.

Modification 1

Figure 13A:
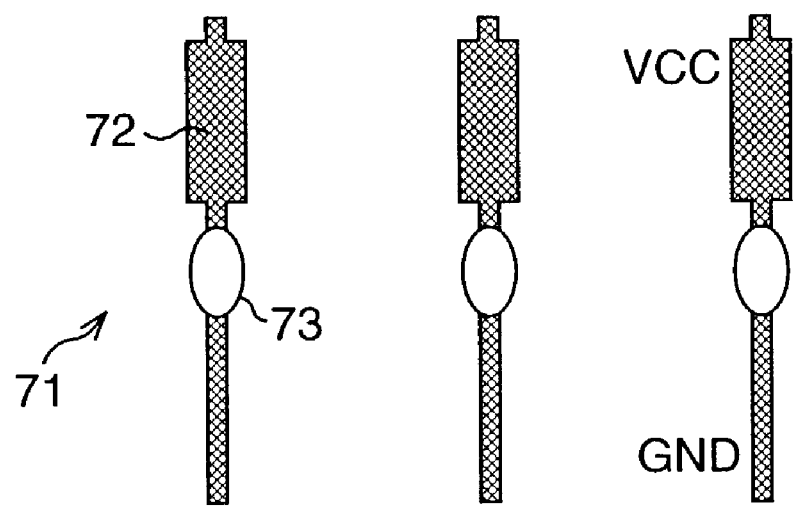
FIGS. 13A and 13B are pattern diagrams for illustrating a structure of a redundant fuse related to a modification 1 of the first embodiment.
Figure 13B:
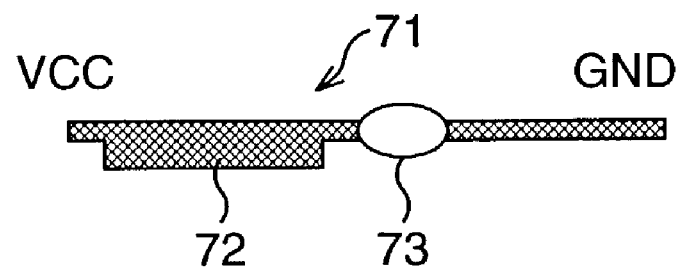

FIGS. 13A and 13B are schematic views showing a structure of a redundant fuse in a modification 1 of the first embodiment. FIG. 13A is a plane view and FIG. 13B is a cross-sectional view.

A redundant length, here a wide structure 72, is provided at a vicinity of a second wire 36a side to which a high voltage (Vcc) is impressed in a redundant fuse 71 of the modification 1 as shown in FIG. 13A. In this case, a disconnected portion 73 is provided on the other end side of the redundant fuse 71, here between a second wire 36b side which is to be the ground potential (GND) and the wide structure 72.

As described above, the wide structure 72 provided in the redundant fuse 71 allows a fuse volume between the disconnected portion 73 and the end of the high voltage impressed side to be increased substantially. Therefore, it is possible to defer a starting point for $Cu^{n+}$ to grow back significantly so as to realize a secured guaranteed life. In addition, there is another effect that an electrical resistance of the redundant fuse 71 which is not disconnected is reduced.

Furthermore, as shown in FIG. 13B, a portion of the wide structure 72 of the redundant fuse 71 may be formed to be a thick film structure which is thick in an up and down direction. This allows a fuse volume between the disconnected portion 73 and the end of the high voltage impressed side (the second wire 36a) to be further increased so as to secure the guaranteed life of the device.

According to the semiconductor device of the modification 1, particularly the redundant fuse 71 which is a component thereof, a corrosion resistance of the fuse 71 can be enhanced and occurrence of corrosion caused by disconnection can be restrained, so that it is possible to sufficiently correspond to further improvement of integration degree in a large scale in the semiconductor device in future.

Modification 2

Figure 14A:
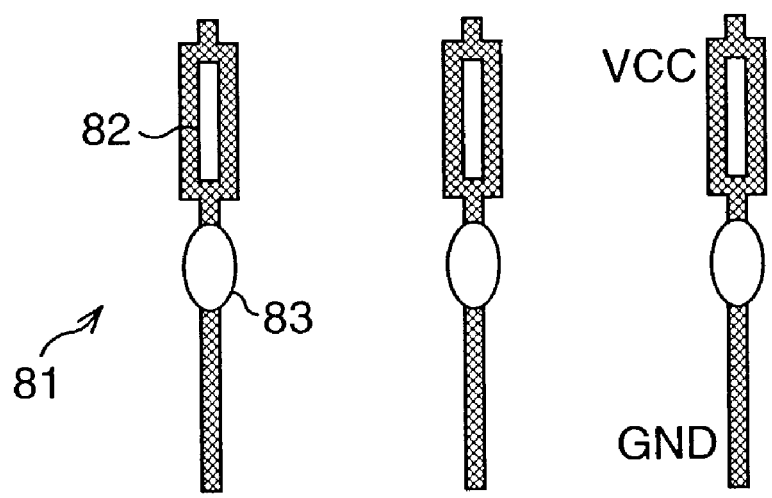
FIGS. 14A and 14B are pattern diagrams for illustrating a structure of a redundant fuse related to a modification 2 of the first embodiment.
Figure 14B:
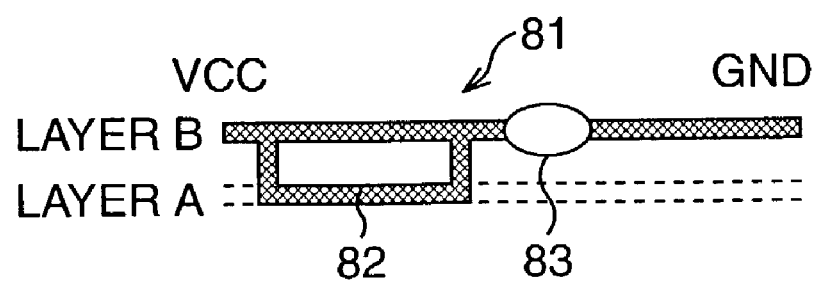

FIGS. 14A and 14B are schematic views showing a structure of a redundant fuse in a modification 2 of the first embodiment. FIG. 14A is a plane view and FIG. 14B is a cross-sectional view.

A redundant length, here a branch structure 82, is provided at a vicinity of a second wire 36a side to which a high voltage (Vcc) is impressed in a redundant fuse 81 of the modification 2 as shown in FIG. 14A. In this case, a disconnected portion 83 is provided on the other end side of the redundant fuse 81, here between a second wire 36b side which is to be the ground potential (GND) and the branch structure 82.

As described above, the branch structure 82 provided in the redundant fuse 81 allows a fuse length between the disconnected portion 83 and the end of the high voltage impressed side to be substantially extended and a fuse volume therebetween to be increased. Therefore, it is possible to defer a starting point for $Cu^{n+}$ to grow back significantly so as to realize a secured guaranteed life. In addition, there is another effect that an electrical resistance of the redundant fuse 81 which is not disconnected is reduced.

Furthermore, as shown in FIG. 14B, the redundant fuse 81 may be formed to be multilevel, in the shown example the fuse layer being formed to be a bi-level, at a portion of the branch structure 82, and the redundant fuse 81 may be structured to further branch up and down between the two layers. This allows a fuse length and volume between the disconnected portion 83 and the end of the high voltage impressed side (the second wire 36a) to be further increased so as to secure the guaranteed life of the device.

According to the semiconductor device of the modification 2, particularly the redundant fuse 81 which is a component thereof, a corrosion resistance of the fuse 81 can be enhanced and occurrence of corrosion caused by disconnection can be restrained, so that it is possible to sufficiently correspond to further improvement of integration degree in a large scale in the semiconductor device in future.

Modification 3

Figure 15A:
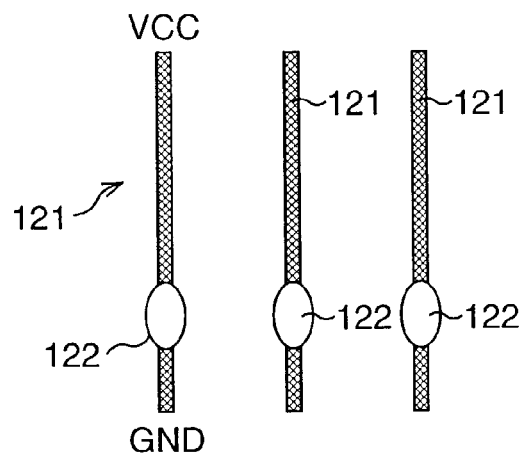
FIGS. 15A and 15B are pattern diagrams for illustrating a structure of a redundant fuse related to a modification 3 of the first embodiment.
Figure 15B:
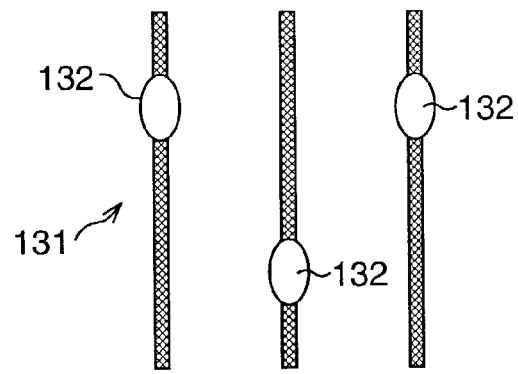

FIGS. 15A and 15B are schematic views showing a structure of a redundant fuse in a modification 3 of the first embodiment. FIG. 15A is a plane view of the redundant fuse in this modification 3 and FIG. 15B is a plane view shown as a comparative example of this modification 3.

A redundant fuse 121 in the modification 3 is, as shown in FIG. 15A, in a straight shape similar to the conventional one, but each adjacent redundant fuse 121 is provided with a disconnected portion 122 on the other end side which is apart from one end side of a second wire 36a to which a high voltage (Vcc) is impressed, here at a vicinity of a second wire 36b which is to be the ground potential (GND).

On the other hand, similar to the comparative example as shown in FIG. 15B, a structure in which disconnected portions 132 of respective redundant fuses 131 are provided alternately is proposed. In the modification 3, it is so structured that all the redundant fuses 121 are disconnected at the other end side which is apart from one end side of the second wire 36a to which a high voltage (Vcc) is impressed. Therefore, it is possible to defer a starting point for $Cu^{n+}$ to grow back significantly so as to realize a secured guaranteed life.

According to the semiconductor device of the modification 3, particularly the redundant fuse 121 which is a component thereof, a corrosion resistance of the fuse 121 can be enhanced and occurrence of corrosion caused by disconnection can be restrained, so that it is possible to sufficiently correspond to further improvement of integration degree in a large scale in the semiconductor device in future.

Second Embodiment

A second embodiment is described next. In this embodiment, a semiconductor device provided with a wire structure having a Cu multilevel wire and a redundant fuse is illustrated similar to the first embodiment. However, they are different in that a material of redundant fuse is different. Note that the same components and the like as those described in the first embodiment are given the same numerals and explanations thereof are omitted.

Figure 16:
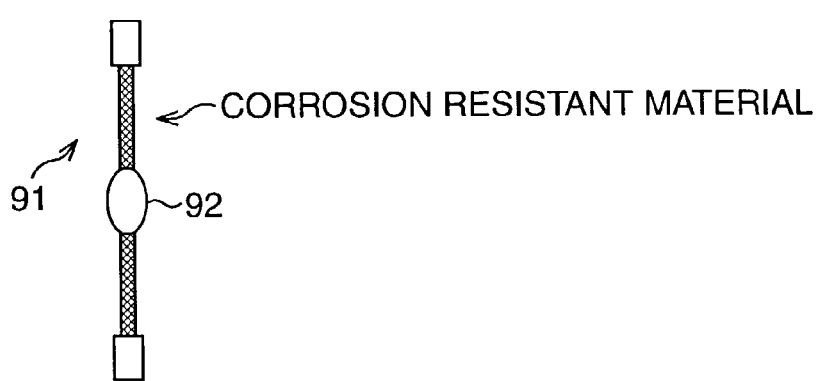
FIG. 16 is a schematic plane view for illustrating a structure of a redundant fuse in a second embodiment.

FIG. 16 is a schematic plane view showing a structure of a redundant fuse in the second embodiment.

A redundant fuse 91 of this embodiment is formed of a corrosion resistant material, for example, metal containing Al or polycrystalline silicon to which an impurity is added. In this case, though there is no limitation to a disconnected portion, it is preferable to provide a disconnected portion 92 at other side of the redundant fuse 91, here at a vicinity of a second wire 36b side which is to be the ground potential (GND).

Figure 17:
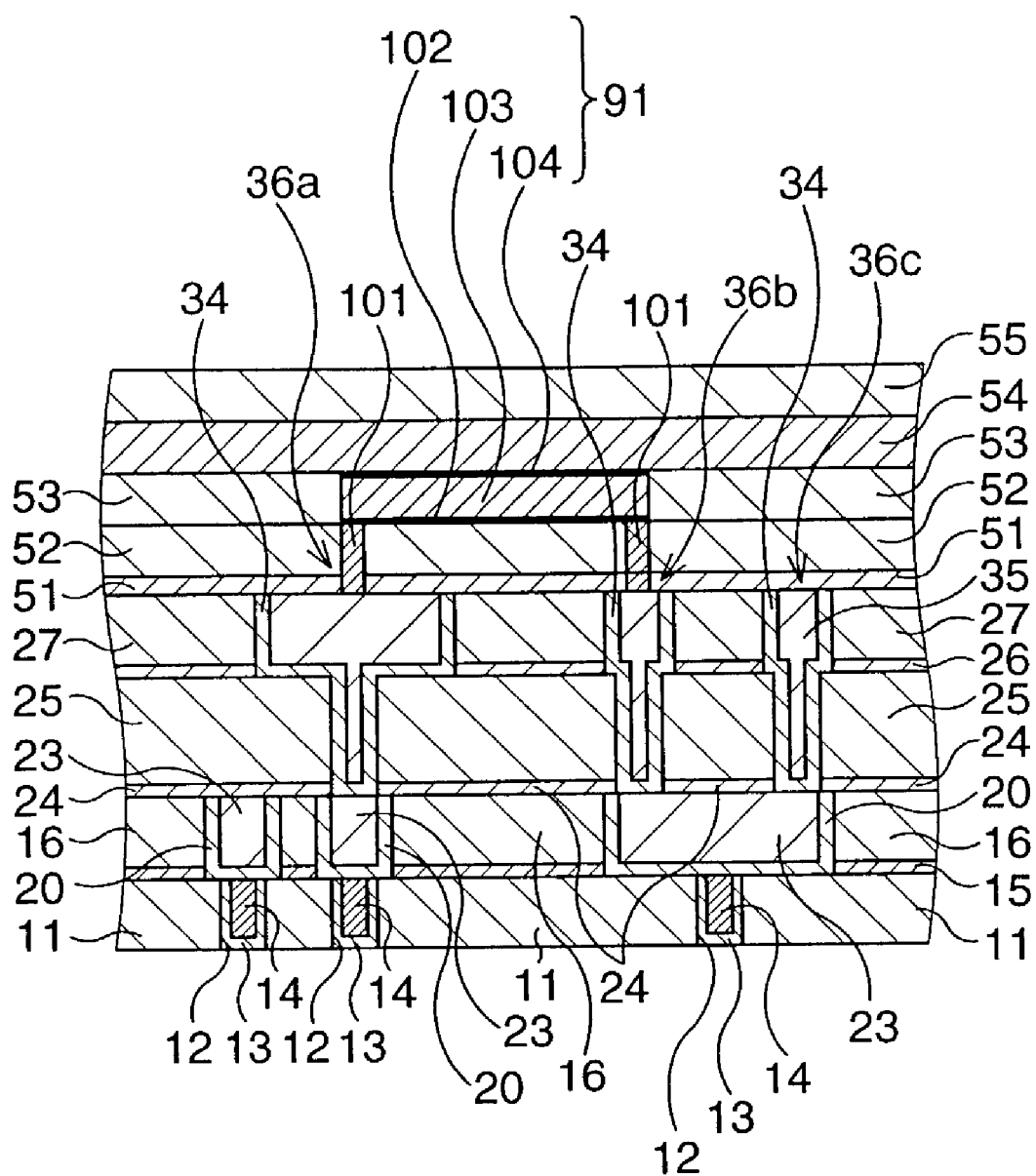
FIG. 17 is a schematic cross-sectional view for illustrating a main structure of a semiconductor device provided with the redundant fuse in the second embodiment.

In this case, the redundant fuse 91, as shown in FIG. 17, is so structured that it is formed of a TiN film 102 with a film thickness of approximately 100 nm, an alloy Al film 103 with a film thickness of approximately 1000 nm, and a bi-level film 104 of TiN and Ti on a W plug 101 via the W plug 101 formed in a SiN film 51 and a $SiO_2$ film 52 above second wires 36a and 36b, which are formed in a $SiO_2$ film 53. Cover films made of a SiN film 54 and a $SiO_2$ film 55 are formed in a manner to cover the redundant fuse 91.

As described above, by forming the redundant fuse 91 with the corrosion resistant material, it is possible to defer a starting point for $Cu^{n+}$ to grow back significantly so as to realize a secured guaranteed life.

Note that this invention is not limited to the various embodiments and modifications described above. For example, the aforementioned redundant length can produce the above-described effect even when another redundant length is formed at a lower voltage impressed side if it is in the high voltage impressed side.

It is also possible to combine the first embodiment and the second embodiment together, that is, to form a redundant fuse with a corrosion resistant material such as Al, polycrystalline silicon, or the like and to further provide the redundant fuse with a redundant length such as a winding structure, a wide/thick film structure, a branch structure, and the like. This structure further restrains and defers a occurrence of the corrosion so as to realize a secured guaranteed life.

According to this invention, the corrosion resistance of the fuse can be enhanced and occurrence of corrosion caused by disconnection can be restrained on the fuse which composed the wire structure along with the wire (particularly a wire containing Cu). Therefore, by improved reliability of each fuse in the semiconductor device, it is possible to increase a number of the fuses mounted and to sufficiently correspond to further improvement of integration degree in a large scale in the semiconductor device in future.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a transistor;
   a wire structure including a wire and a fuse,
   wherein said fuse is connected to said wire so as to form a connection, and has a redundant length for delaying corrosion,
   wherein said redundant length is in a winding structure having a plurality of winding parts formed at a portion of said fuse between said connection to said wire and a disconnect portion; and,
   wherein said winding structure has said plurality of winding parts in horizontal right and left directions of a same layer and vertical up and down directions between multiple layers respectively.

2. The semiconductor device according to claim 1, wherein the winding structure is formed to be multilevel.

3. The semiconductor device according to claim 1, wherein said redundant length is formed at a portion of said fuse, as a wider structure and/or a thicker film structure, relative to said wire.

4. The semiconductor device according to claim 1, wherein said wire is made of a material containing at least copper.

5. The semiconductor device according to claim 1, wherein said redundant length is provided between a disconnected portion of said fuse and a high voltage impressed side.

6. The semiconductor device according to claim 1, wherein said redundant length is in a winding structure having a plurality of winding parts and said plurality of winding parts are located in series between the connection to the wire and the disconnection portion.

7. A semiconductor device, comprising:
   a wire structure having a wire containing at least copper and a fuse,
   wherein said fuse is connected to said wire, and is formed of a corrosion resistant material and a TiN film,
   wherein the corrosion resistant material is polycrystalline silicon.

8. The semiconductor device according to claim 1, wherein said winding structure is formed having a plurality of winding parts in both a plane-view direction and a side-view direction.

* * * * *